(12) United States Patent
Liao (10) Patent No.: US 7,629,614 B2
(45) Date of Patent: Dec. 8, 2009

(54) ELECTROSTATIC DISCHARGE PROTECTION CIRCUIT AND DIODE THEREOF

(75) Inventor: Ta-Wen Liao, Miaoli County (TW)

(73) Assignee: Au Optronics Corporation, Hsinchu (TW)

( * ) Notice: Subject to any disclaimer, the term of this patent is extended or adjusted under 35 U.S.C. 154(b) by 584 days.

(21) Appl. No.: 11/309,143

(22) Filed: Jun. 27, 2006

(65) Prior Publication Data
US 2007/0170510 A1 Jul. 26, 2007

(30) Foreign Application Priority Data
Jan. 20, 2006 (TW) .............................. 95102235 A (51) Int. Cl.
*H01L 23/60* (2006.01)
(52) U.S. Cl. .................. 257/72; 257/360; 257/E29.327
(58) Field of Classification Search .................. 257/72, 257/360, E29.327
See application file for complete search history.

(56) References Cited

U.S. PATENT DOCUMENTS

| 6,043,971 A | 3/2000 | Song et al. ................. 361/111 |
|---|---|---|
| 6,175,394 B1 * | 1/2001 | Wu et al. ...................... 349/40 |
| 6,323,490 B1 * | 11/2001 | Ikeda et al. ............. 250/370.09 |
| 6,337,722 B1 | 1/2002 | Ha ............................... 349/40 |
| 6,493,047 B2 | 12/2002 | Ha ............................... 349/40 |
| 6,587,160 B2 * | 7/2003 | Lee et al. ....................... 349/40 |
| 6,838,700 B2 | 1/2005 | Trainor et al. ................. 257/72 |
| 7,375,724 B2 * | 5/2008 | Jiang et al. .................. 345/204 |
| 2002/0101547 A1 * | 8/2002 | Lee et al. ...................... 349/40 |
| 2006/0244892 A1 * | 11/2006 | Asai et al. .................... 349/151 |
| 2007/0268637 A1 * | 11/2007 | Hsu et al. ...................... 361/56 |

* cited by examiner

*Primary Examiner*—Evan Pert
(74) *Attorney, Agent, or Firm*—Jianq Chyun IP Office (57) ABSTRACT

A diode disposed on a substrate is provided. The diode includes a semiconductor pattern, a first conductor pattern, a second conductor pattern, an insulating layer, and a top conductor pattern. The first conductor pattern and the second conductor pattern are respectively disposed on a portion of the semiconductor pattern. The insulating layer is disposed on the first conductor layer, the second conductor layer, and the semiconductor pattern. Moreover, the top conductor pattern is disposed on the insulating layer above the semiconductor pattern and electrically connected to the first conductor pattern. In the diode mentioned above, no circuit belonging to the diode is disposed under the semiconductor pattern. Therefore, when the aforementioned diode and other devices are integrated, layout of the devices can adopt the space under the diode.

18 Claims, 9 Drawing Sheets

ELECTROSTATIC DISCHARGE PROTECTION CIRCUIT AND DIODE THEREOF

CROSS-REFERENCE TO RELATED APPLICATION

This application claims the priority benefit of Taiwan application serial no. 95102235, filed on Jan. 20, 2006. All disclosure of the Taiwan application is incorporated herein by reference.

BACKGROUND OF THE INVENTION

1. Field of Invention

The present invention relates to an electrostatic discharge protection circuit (ESD protection circuit). More particularly, the present invention relates to a diode of preferred electrostatic conductivity and an ESD protection circuit composed thereof.

2. Description of Related Art

Multimedia technology in present society is quite prosperous mainly due to the progress the semiconductor and display technology. As for the display, the liquid crystal display (LCD), with advantages such as high picture quality, good space utilization, low power consumption, and no radiation, has gradually become the mainstream of the market. Generally, during the fabricating process of an LCD, operators, machines, and inspection instruments may all carry static electricity. Therefore, when the above charged bodies (operators, machines, or inspection instruments) make contact with an LCD panel, the devices and circuits in the LCD panel may be damaged by electrostatic discharge.

To avoid the devices and circuits in the LCD panel from being damaged by electrostatic discharge, an ESD protection device is usually formed on the thin film transistor (TFT) array substrate of the LCD panel, wherein the ESD protection device is generally formed on the substrate together with the TFT and a pixel electrode. In general, before the ESD protection device is formed, a TFT with three terminals is formed on the substrate, and then the gate and drain in the TFT are electrically connected to each other. At this time, the TFT with its gate and drain electrically connected is equivalent to a diode with two terminals, and the diode can be used as an ESD protection device.

Figure 1:
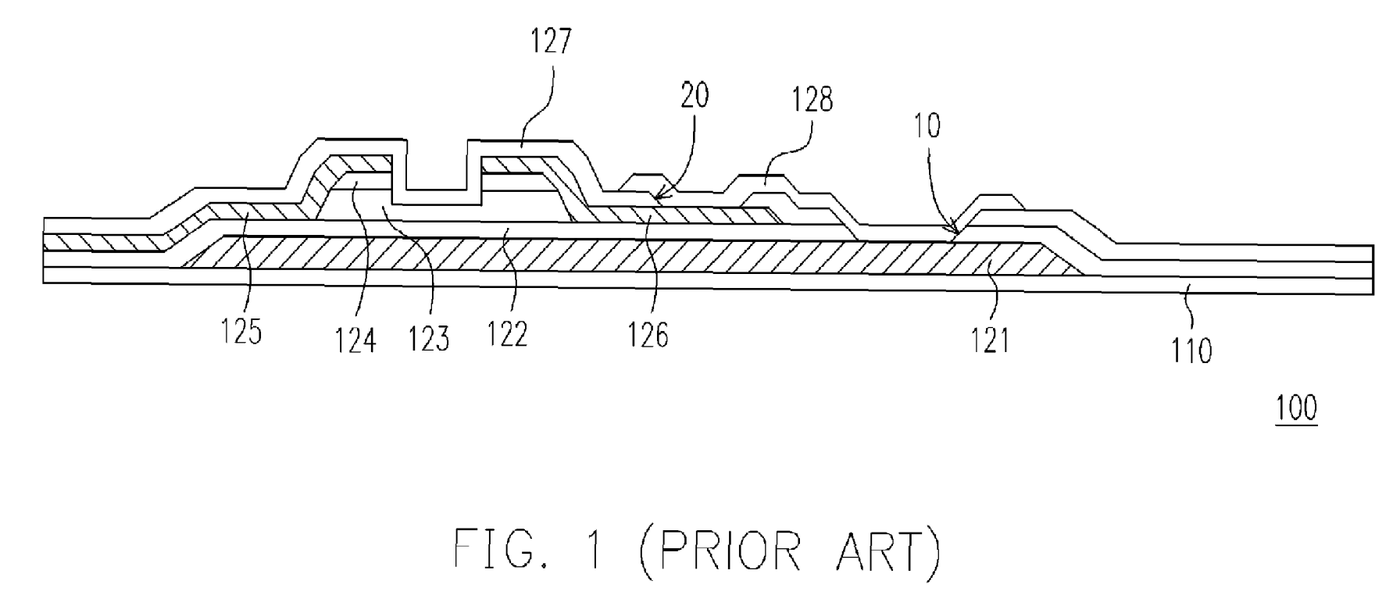
FIG. 1 shows a schematic sectional view of a conventional ESD protection device.

Referring to FIG. 1, it shows the schematic sectional view of a conventional diode used as an ESD protection device. The structure of a conventional diode 100 is similar to a bottom gate TFT. It can be seen from FIG. 1 that, the diode 100 includes a gate 121, a gate insulating layer 122, a channel layer 123, an ohmic contact layer 124, a source 125, a drain 126, a protection layer 127, and a transparent electrode 128.

The gate 121 is disposed on a substrate 110, and the gate insulating layer 122 covers the gate 121 on the substrate 110. Moreover, the channel layer 123 is disposed on the gate insulating layer 122 above the gate 121. It can be seen from FIG. 1 that, the source 125 and the drain 126 are respectively disposed at both sides of the channel layer 123 and cover a portion of the insulating layer 122. The ohmic contact layer 124 is generally formed between the source 125 (or the drain 126) and the channel layer 123 to reduce the contact impedance between the source 125 (or the drain 126) and the channel layer 123.

Besides, the protection layer 127 covers the source 125, drain 126, channel layer 123, and gate insulating layer 122. It can be seen from FIG. 1 that, before the source 125, drain 126, and channel layer 123 are formed, a contact window 10 is formed in the protection layer 127 and the gate insulating layer 122 to expose a portion of the gate 121. Besides, another contact window 20 is formed in the protection layer 127 to expose a portion of the drain 126. The contact windows 10 and 20 are filled with a portion of above-mentioned transparent electrode 128, whereby it is electrically connected to the gate 121 via the contact window 10, and is electrically connected to the drain 126 via the contact window 20.

When the electrostatic discharge phenomenon occurs, the foregoing ESD protection device 100 can consume the electrostatic energy and lead the static electricity out, so as to prevent the devices in the LCD panel from being damaged by electrostatic discharge. As the electrostatic discharge protecting ability of the ESD protection device 100 is limited, the producers fabricate enough ESD protection devices 100 on the substrate 110 to prevent the devices and circuits in the LCD panel from being damaged by electrostatic discharge. However, it may relatively reduce the area of the substrate 110 available for layout. Further, if the gate 121 in the ESD protection device 100 is damaged or disconnected, the whole ESD protection device 100 will stop operating.

SUMMARY OF THE INVENTION

In view of the above, an object of the invention is to provide a diode with preferred ability to conduct static electricity and preferred reliability.

Another object of the invention is to provide an ESD protection circuit including multiple diodes of the invention, whereby the ESD protection circuit has preferred ability to conduct static electricity with the same layout area.

To achieve the above or other objects, the invention provides a diode suitable to be disposed on a substrate. The diode includes a semiconductor pattern, a first conductor pattern, a second conductor pattern, an insulating layer, and a top conductor pattern. The first conductor pattern and the second conductor pattern are respectively disposed on a portion of the semiconductor pattern, and are separated from each other by the semiconductor pattern. Moreover, the insulating layer is disposed on the first conductor pattern, the second conductor pattern, and the semiconductor pattern. The insulating layer has a first contact window to expose a portion of the first conductor pattern. Besides, the top conductor pattern is disposed on the insulating layer above the semiconductor pattern, and is electrically connected to the first conductor pattern via the first contact window.

According to the diode described in a prefered embodiment of the present invention, the semiconductor pattrern includes an amorphus silcon layer and an ohmic contact layer. The ohmic contact layer is disposed between the amorphous silcon layer and the first conductor pattern and between the amorphous silcon layer and the second conductor pattern.

According to the diode described in a preferred embodiment of the present invention, the ohmic contact layer includes, for example, an N-type doped amorphous silicon layer.

According to the diode described in a preferred embodiment of the present invention, at least one of the first and second conductor patterns is comprised of metal.

According to the diode described in a preferred embodiment of the present invention, the top conductor pattern is comprised of indium tin oxide or indium zinc oxide.

According to the diode described in a preferred embodiment of the present invention, a dielectric layer disposed on the substrate is further included, wherein the first conductor pattern, the second conductor pattern, and the insulating layer are disposed on the dielectric layer.

According to the diode described in a preferred embodiment of the present invention, a bottom conductor pattern and a dielectric layer are further included. The bottom conductor pattern is disposed on the substrate and under the semiconductor pattern. The top conductor pattern is electrically connected to the bottom conductor pattern. Besides, the dielectric layer is disposed over the substrate to cover the bottom conductor pattern. The dielectric layer and the insulating layer have a second contact window, and the bottom conductor pattern is electrically connected to the top conductor pattern via the second contact window.

According to the diode described in a preferred embodiment of the present invention, the bottom conductor pattern is comprised of metal.

The present invention further provides an ESD protection circuit on a substrate. The ESD protection circuit comprises a plurality of diodes electrically connected to each other. Each of the plurality of diodes comprises a semiconductor pattern, a first conductor pattern, a second conductor pattern, an insulating layer and a top conductor pattern. The first conductor pattern is disposed on a portion of the semiconductor pattern and the second conductor pattern is disposed on a portion of the semiconductor pattern. The first conductor pattern and the second conductor pattern are separated from each other by the semiconductor pattern. The insulating layer is disposed on the first conductor pattern, the second conductor pattern and the semiconductor pattern; the insulating layer has a first contact window to expose a portion of the first conductor pattern. The top conductor pattern is disposed on the insulating layer and the top conductor pattern is disposed above the first conductor pattern, the second conductor pattern and the semiconductor pattern; the top conductor pattern is electrically connected to the first conductor pattern via the first contact window.

According to the ESD protection circuit described in a preferred embodiment of the present invention, the diodes are, for example, forward diodes or backward diodes.

According to the ESD protection circuit described in a preferred embodiment of the present invention, a proportion of the diodes are forward diodes and the rest are backward diodes, wherein the forward diodes and the backward diodes are connected in parallel.

In view of the above, the top conductor pattern and the bottom conductor pattern of the ESD protection circuit of the invention are respectively disposed above and beneath the semiconductor pattern, and the top conductor pattern is electrically connected to the bottom conductor pattern. Therefore, the ESD protection circuit of the present invention has a preferred ability to conduct static electricity. Moreover, when the bottom conductor pattern or the top conductor pattern is damaged, the diodes in the ESD protection circuit still have the function of electrostatic discharge protection.

In order to the make the aforementioned and other objects, features, and advantages of the present invention comprehensible, preferred embodiments accompanied with drawings are described in detail below.

DESCRIPTION OF EMBODIMENTS

The ESD protection circuit of the invention is usually fabricated on the active device array substrate of the LCD panel (not shown), and the ESD protection circuit can be formed together with the pixel structure of an ordinary LCD panel. The ESD protection circuit of the invention is formed by electrically connecting multiple diodes of the invention. In particular, the diodes for forming an ESD protection circuit can be forward diodes or backward diodes. It should be particularly announced that the diodes could adopt any electrical connecting manner to form an ESD protection circuit, wherein the electrical connecting manner can be series connection or parallel connection and is not limited herein. The following part will illustrate the structure and fabricating flow of the ESD protection circuit with reference to preferred embodiments.

The First Embodiment

Figure 2A:
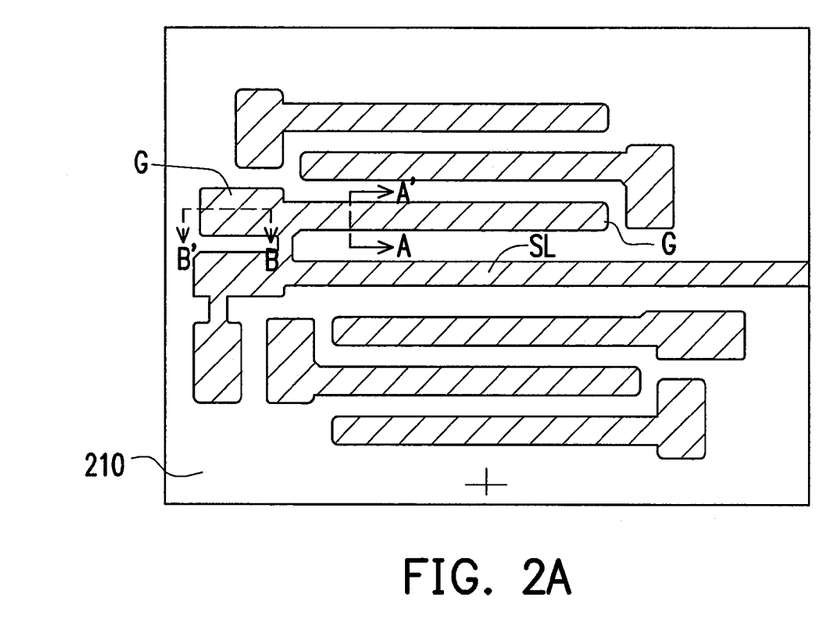
FIGS. 2A~2E show schematic flow charts of the ESD protection circuit and the diode thereof according to a first embodiment of the present invention.

FIGS. 2A~2E show schematic flow charts of the ESD protection circuit and the diode thereof according to a first embodiment of the invention. FIGS. 3A~3E show the schematic sectional views sequentially taken along section lines A-A' and B-B' of FIG. 2A~2E correspondingly. Referring to FIGS. 2A and 3A first, a substrate 210 is provided and a bottom conductor pattern G is formed thereon. The bottom conductor pattern G can be formed together with a gate and a scan line SL of the active device (not shown) in an LCD panel. It can be seen from FIG. 2A that, the bottom conductor pattern G can be electrically connected to the scan line SL.

Figure 2B:
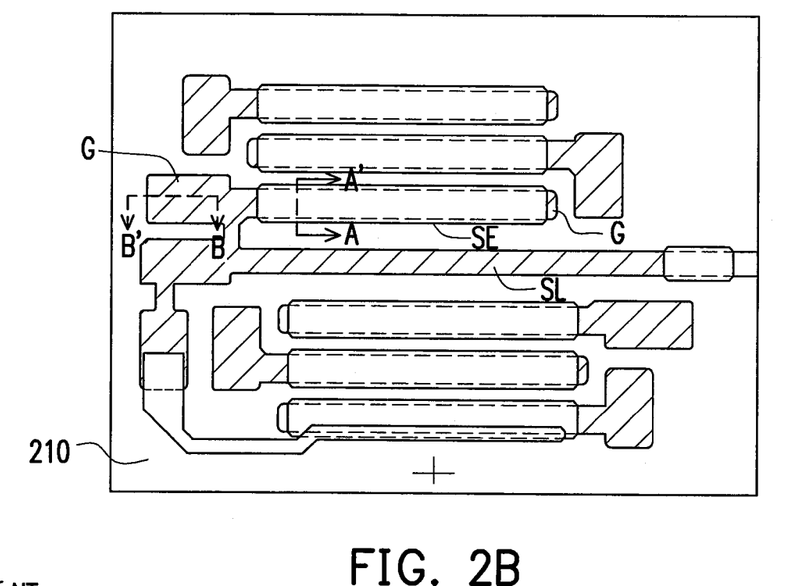
Figure 3A:
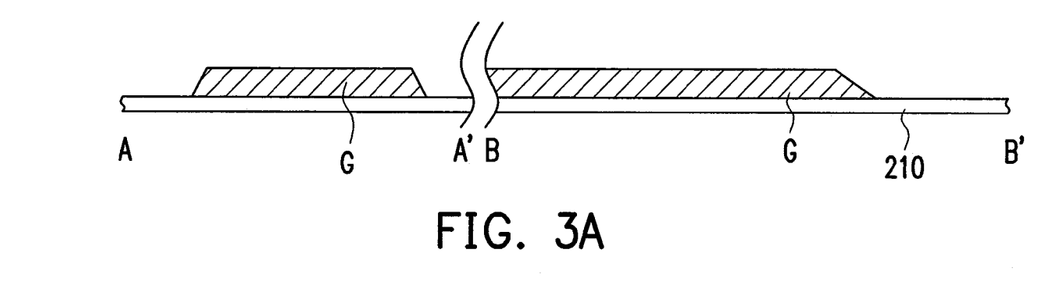
FIGS. 3A~3E show schematic sectional views taken along the section lines A-A' and B-B' of FIGS. 2A~2E.
Figure 3B:
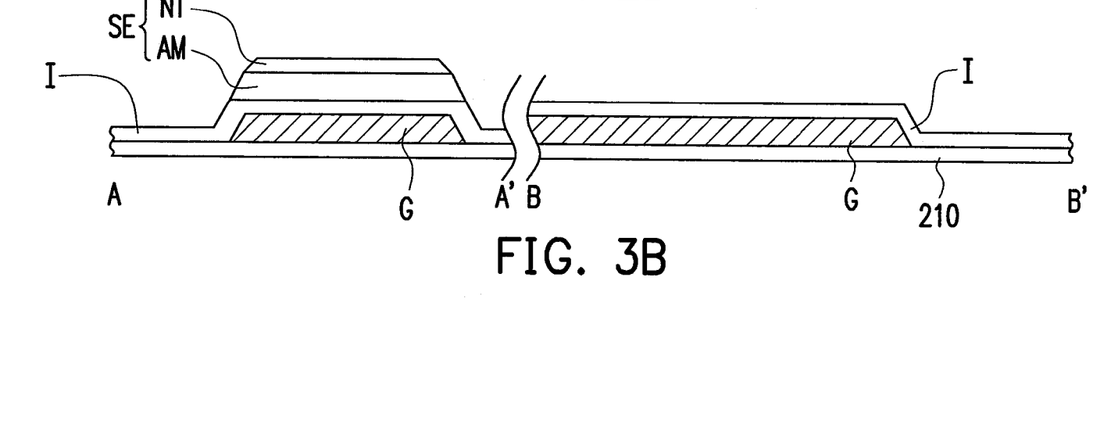

Continuing reference to FIGS. 2B and 3B, a dielectric layer I is formed on the bottom conductor pattern G to cover the bottom conductor pattern G. The material of the dielectric layer I is, for example, silicon nitride, silicon oxide, or silicon oxynitride. It should be noticed that, the dielectric layer I covers the substrate 210 and the bottom conductor pattern G. For the simplicity of the drawing, the dielectric layer I is not shown in FIG. 2B, but can be seen in FIG. 3B. Then, a semiconductor material layer SE is formed on the dielectric layer I above the bottom conductor pattern G. The semiconductor material layer SE is formed by an amorphous silicon material AM and an N-type doped amorphous silicon material NT. It is notable that, the foregoing dielectric layer I can be formed together with the gate insulating layer (not shown) of the active device in an LCD panel.

Figure 2C:
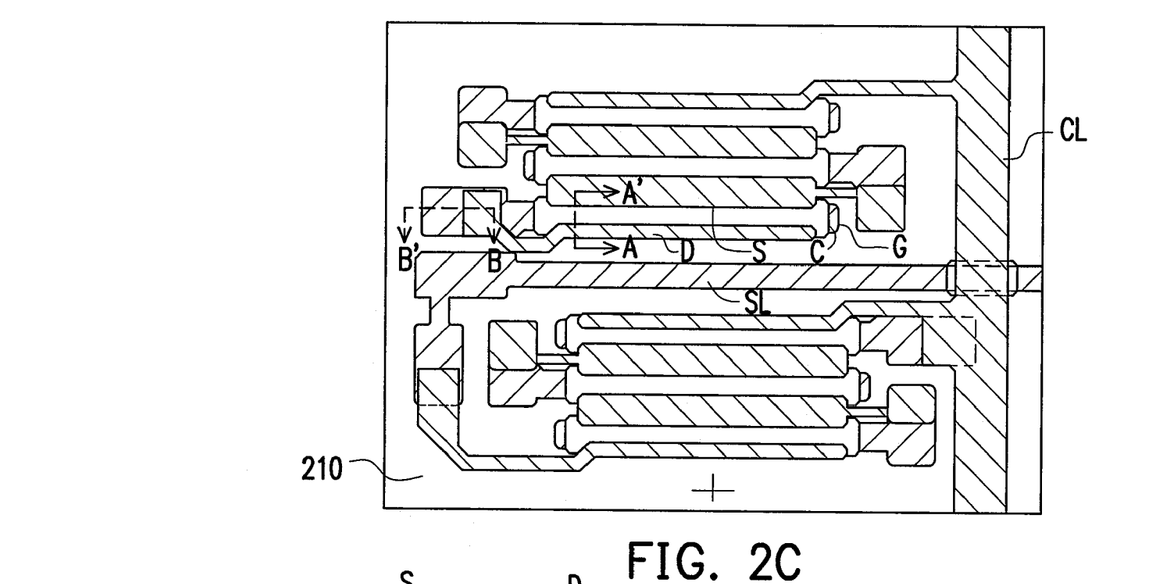
Figure 3C:
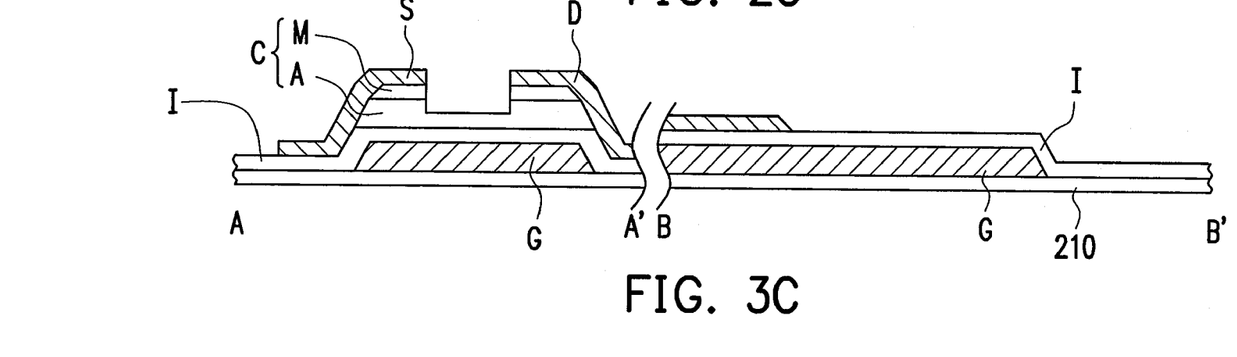

Then, referring to FIGS. 2C and 3C, the above-mentioned semiconductor material layer SE is patterned to form a semiconductor pattern C. Then, a first conductor pattern D and a second conductor pattern S are formed on a portion of the semiconductor pattern C. The material of the first conductor pattern D and the second conductor pattern S is, for example, metal Mo/Al/Mo, Ti/Al/Ti, Cr/Al/Cr, Al/Cr, Mo, Cr, Al alloy, Mo/Al alloy/Mo, Mo/Al alloy, Al alloy/Mo, and the like or derivatives thereof. It can be clearly seen from FIG. 3C that the amorphous silicon material AM and the N-type doped amorphous silicon material NT can respectively form an amorphous silicon layer A and an ohmic contact layer M. The amorphous silicon material and the N-type doped amorphous silicon material can be replaced by poly-silicon material to form a poly-silicon layer and an ohmic contact layer respectively. Moreover, the first conductor pattern D and the second conductor pattern S can be formed together with the data line (not shown), the common line CL, and the source (not shown) and drain (not shown) in the active device of an LCD panel. Besides, the semiconductor pattern C can be formed together with the channel layer (not shown) of the active device.

Figure 2D:
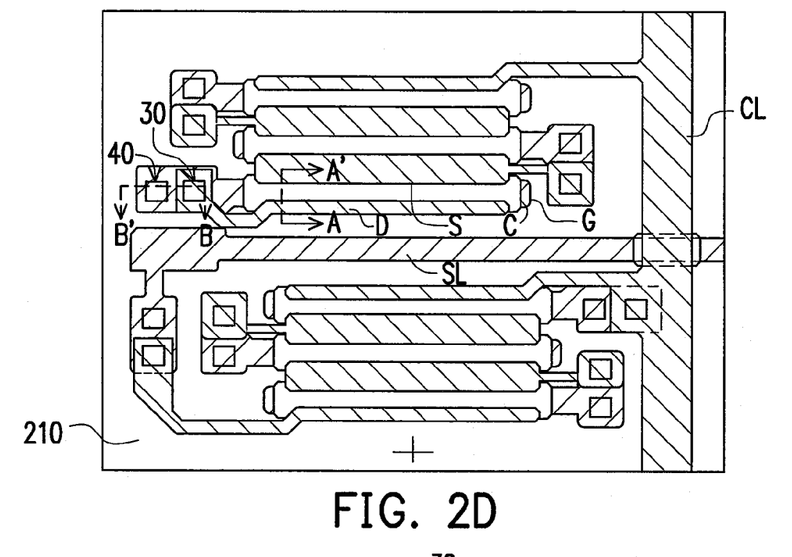
Figure 3D:
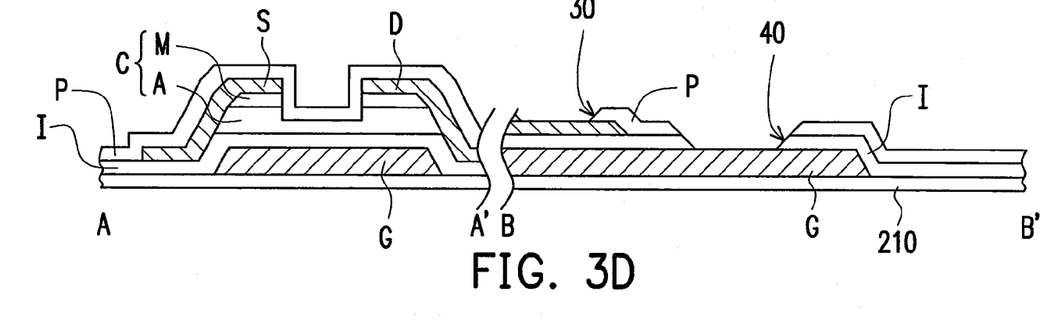

Next, referring to FIGS. 2D and 3D, an insulating layer P is disposed on the first conductor pattern D, the second conductor pattern S, and the semiconductor pattern C. The material of the insulating layer P is, for example, silicon nitride, silicon oxide, or silicon oxynitride, and the insulating layer P can be of the same layer as the protection layer formed on the active device in an LCD panel. It can be clearly seen from FIG. 3D that, the insulating layer P disposed above the first conductor pattern D has a first contact window 30 for exposing the first conductor pattern D. Moreover, the insulating layer P and the dielectric layer I have a second contact window 40 for exposing the bottom conductor pattern G.

It should be particularly illustrated that, since the insulating layer P covers the first conductor pattern D, the second conductor pattern S, and the semiconductor pattern C, for the simplicity of the drawing, FIG. 2D only shows the positions of the first contact window 30 and the second contact window 40 while neglects the insulating layer P; however, the insulating layer P can be clearly seen in FIG. 3D.

Figure 2E:
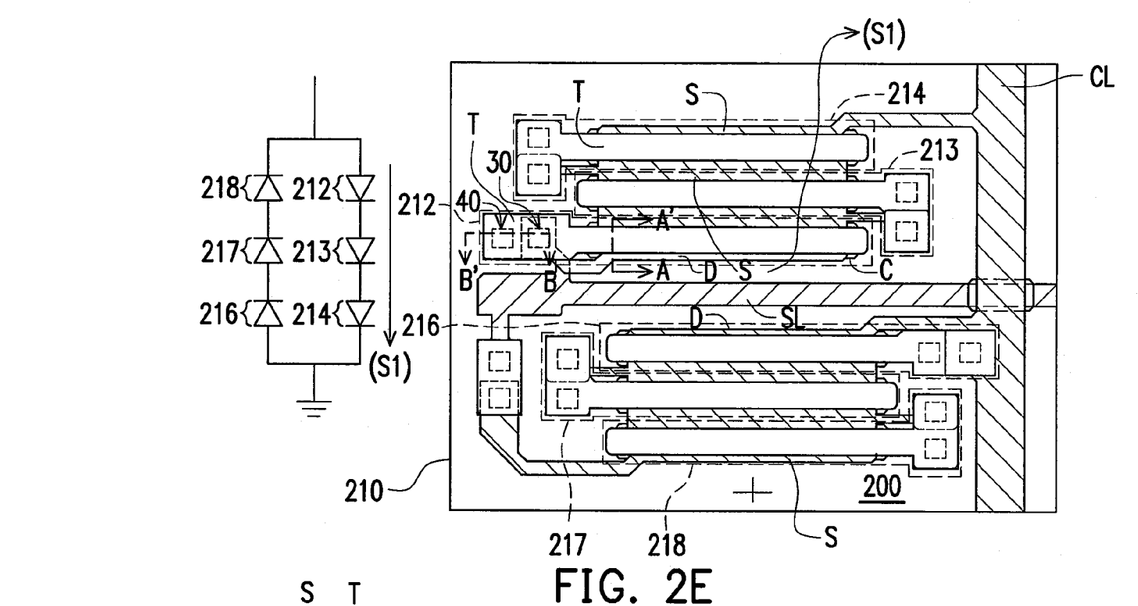
Figure 3E:
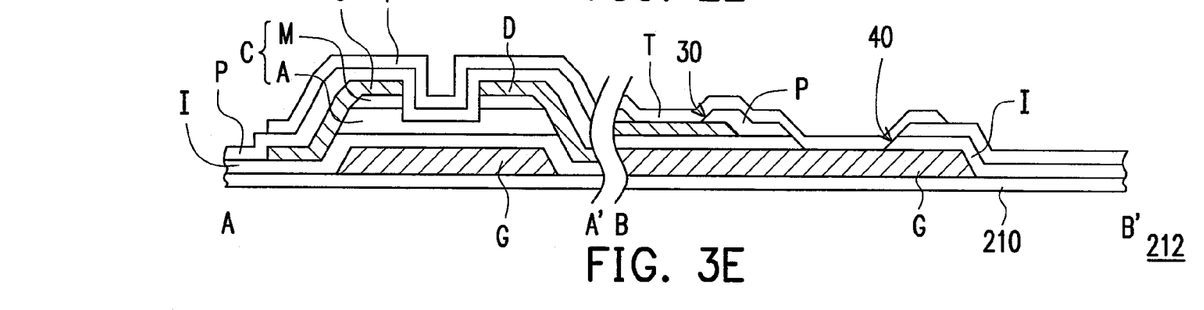

Then, referring to FIGS. 2E and 3E, a top conductor pattern T is formed on the insulating layer P above the semiconductor pattern C. The top conductor pattern T is respectively electrically connected to the first conductor pattern D and the bottom conductor pattern G via the first contact window 30 and the second contact window 40. The material of the top conductor pattern T is, for example, indium tin oxide, indium zinc oxide, ZnO, or AZO, and it can be formed together with the pixel electrode (not shown) in an LCD panel. The fabricating flow of the ESD protection circuit 200 (as shown in FIG. 2E) and the diode 212 thereof (as shown in FIG. 3E) is thereby completed. The ESD protection circuit 200 is formed by three forward diodes (212, 213, and 214) and three backward diodes (216, 217, and 218). The structures of the ESD protection circuit 200 and the diode 212 will be illustrated in detail hereinafter.

With continued reference to FIGS. 2E and 3E, the ESD protection circuit 200 of the invention is suitable to be disposed on a substrate 210. The ESD protection circuit 200 includes multiple diodes 212, and the diodes 212 are electrically connected to each other. It can be seen from FIG. 2E that, the electrical connecting manner of the diodes 212 of the embodiment is that the three forward diodes 212, 213, and 214 are connected in parallel with the three backward diodes 216, 217, and 218. In an embodiment, the producers can design the electrical connecting manner of the diodes 212, 213, 214, 216, 217, and 218 according to practical demands, and it is not limited to the diode electrical connecting manner and the diode number as shown in FIG. 2E.

It can be clearly seen in FIG. 3E that the diode 212 of the invention is suitable to be disposed on a substrate 210. The diode 212 includes a bottom conductor pattern G, a dielectric layer I, a semiconductor pattern C, a first conductor pattern D, a second conductor pattern S, an insulating layer P, and a top conductor pattern T. The bottom conductor pattern G is disposed on the substrate 210, and the dielectric layer I covers the conductor pattern G. Moreover, the semiconductor pattern C is disposed on the substrate 210 and on the dielectric layer I above the conductor pattern G.

In particular, the aforementioned semiconductor pattern C can be formed by amorphous silicon layer A and an ohmic contact layer M. The ohmic contact layer M is disposed between the amorphous silicon layer A and the first conductor pattern D and between the amorphous silicon layer A and the second conductor pattern S. Besides, the first conductor pattern D and the second conductor pattern S are respectively disposed on a portion of the semiconductor pattern C, wherein the first conductor pattern D and the second conductor pattern S are eclectically insulated from each other. It can be seen in FIG. 2E that the second conductor pattern S of the diode 214 and the first conductor pattern D of the diode 216 can be electrically connected to the common line CL in an LCD panel. The common line CL can be electrically connected to a reference voltage (common voltage source) (not shown).

Furthermore, the insulating layer P is disposed on the first conductor pattern D, the second conductor pattern S, and the semiconductor pattern C. The insulating layer P, the first conductor pattern D, and the second conductor pattern S can be disposed on the dielectric layer I. The insulating layer P has the first contact window 30 for exposing a portion of the first conductor pattern D (as shown in FIG. 3E), while the second contact window 40 exposed the bottom conductor pattern G.

The top conductor pattern T of the invention is disposed on the insulating layer P above the semiconductor pattern C. The top conductor pattern T is respectively electrically connected to the first conductor pattern D and the bottom conductor pattern G via the contact windows 30 and 40. It is notable that, the first conductor pattern D of the diode 212 is electrically connected to the scan line SL via the top conductor pattern T and the contact window 40. Moreover, the second conductor pattern S of the diode 218 is electrically connected to the scan line SL. When the electrostatic discharge phenomenon occurs, the high voltage of the static electricity may be applied to the scan line SL or the first conductor pattern D. The static electricity can sequentially pass the diodes 212, 213, and 214, and is led out by the common line CL at last (the path S1 as shown in FIG. 2E).

It is notable that, the semiconductor pattern C is disposed between the top conductor pattern T and the bottom conductor pattern G. The top conductor pattern T is electrically connected to the bottom conductor pattern G. When the electrostatic discharge phenomenon occurs, the high voltage generated by static electricity may be applied to the top conductor pattern T and the bottom conductor pattern G, to form a channel on the upside of the semiconductor pattern C near the top conductor pattern T, and form another channel on its downside near the bottom conductor pattern G. In other words, the semiconductor pattern C of the diode 212 of the invention can generate two channels; therefore, it can have better static electricity conducting ability than a conventional protection device 100. So the ESD protection circuit 200 formed by diodes 220 has better electrostatic discharge protection ability.

Compared with the conventional ESD protection device 100, under the same electrostatic protection ability, the ESD protection circuit 200 of the invention only requires fewer diodes 212 to achieve the same performance; therefore, the area available for layout on the substrate 210 can be relatively increased. Moreover, as the top conductor pattern T is electrically connected to the bottom conductor pattern G, if the bottom conductor pattern G is damaged, the diode 220 can still conduct the static electricity via the top conductor pattern T, so it only loses its function partially, and vice versa. Therefore, the diode 212 of the invention is more reliable. Furthermore, the ESD protection circuit 200 of the invention can be formed together with the pixel structure of the LCD panel onto the substrate 210; thus, no additional process is required.

The Second Embodiment

Figure 4:
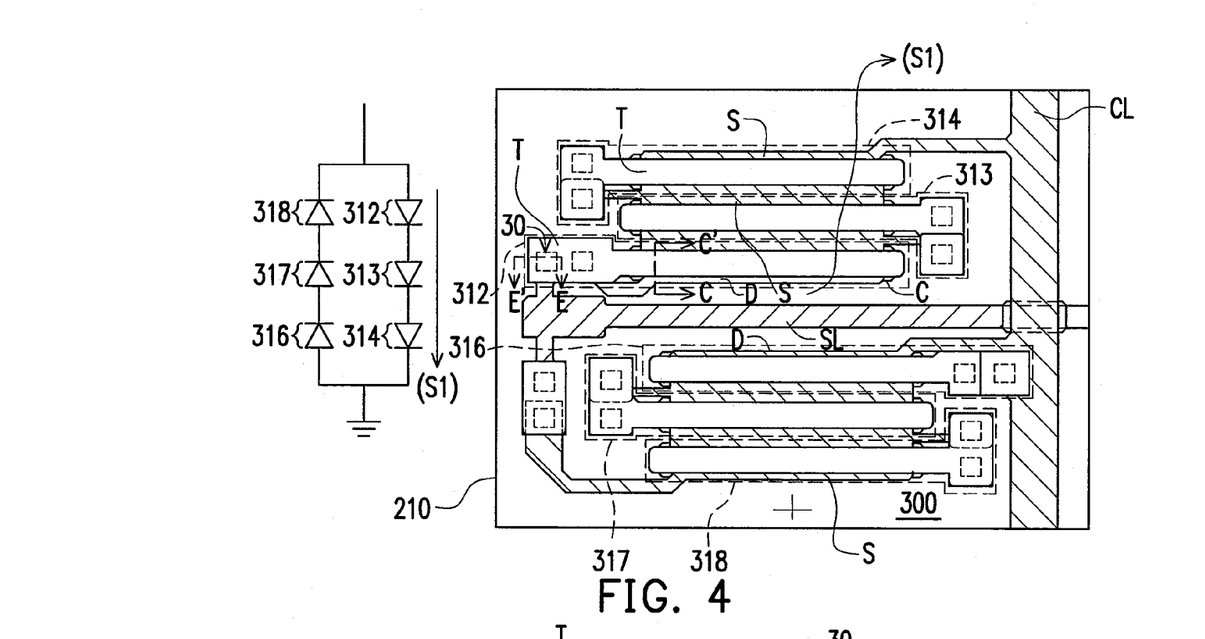
FIG. 4 shows a schematic view of the ESD protection circuit and the equivalent circuit thereof according to a second embodiment of the present invention.
Figure 5:
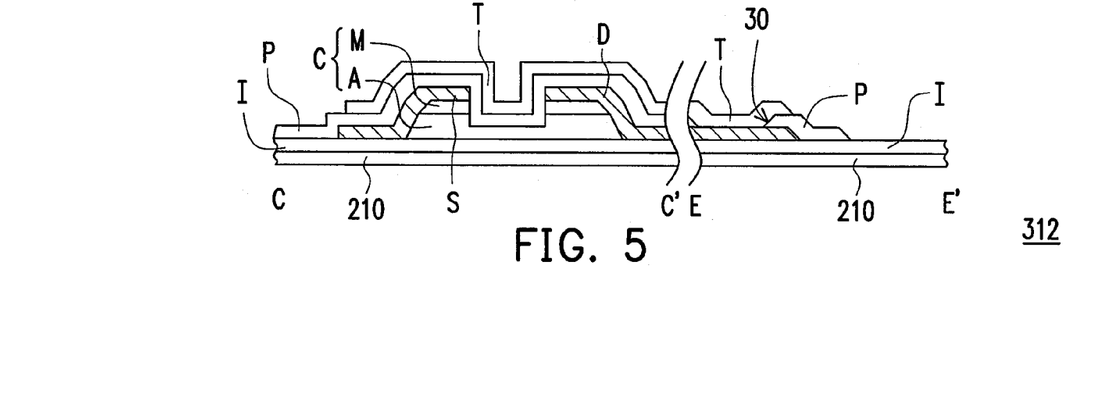
FIG. 5 shows a schematic sectional view of the ESD protection circuit in FIG. 4 taken along the section lines C-C' and E-E'.

The embodiment is quite similar to the first embodiment, and the difference lies in that the diode in the present embodiment does not have a bottom conductor pattern. FIG. 4 shows a schematic view of the ESD protection circuit and its equivalent circuit according to the second embodiment of the invention. FIG. 5 shows a schematic sectional view of the ESD protection circuit in FIG. 4 taken along section lines C-C' and E-E'. Referring to FIGS. 4 and 5 at the same time, the diode 312 of the invention includes a semiconductor pattern C, a first conductor pattern D, a second conductor pattern S, an insulating layer P, and a top conductor pattern T. Generally, a dielectric layer I is first formed on the substrate 210, to facilitate the forming of the semiconductor pattern C on the substrate 210. It should be emphasized that, in the embodiment, the bottom conductor pattern G will not be made beneath the semiconductor pattern C. In other words, no circuit belonging to the diode 312 will be formed beneath the semiconductor pattern C in the diode 312.

Furthermore, the first conductor pattern D and the second conductor pattern S are respectively disposed on a portion of the semiconductor pattern C. The first conductor pattern D and the second conductor pattern S are electrically insulated from each other. Besides, the insulating layer P is disposed on the first conductor pattern D, the second conductor pattern S, and the semiconductor pattern C. The insulating layer P, the first conductor pattern D, and the second conductor pattern S can be disposed on the dielectric layer I. The insulating layer P has a first contact window 30 for exposing a portion of the first conductor pattern D. The top conductor pattern T of the invention is disposed on the insulating layer P above the semiconductor pattern C, and is electrically connected to the first conductor pattern D via the contact window 30.

It is notable that, the first conductor pattern D of the diode 312 is electrically connected to the scan line SL via the top conductor pattern T and the first contact window 30 (as shown in FIG. 4). The second conductor pattern S of the diode 318 is electrically connected to the scan line SL. Besides, the second conductor pattern D of the diode 314 and the first conductor pattern S of the diode 316 can be electrically connected to the common line CL, while the common line CL is electrically connected to a reference voltage (common voltage source) (not shown).

In general, there are many sensitive electronic devices and dense circuits on the active device array substrate in the LCD panel. It is avoided to dispose nearby metal wires or electrodes that may cause interference to the electronic devices and circuits. As the diode 312 of the invention forms no circuit beneath the first conductor pattern D, when the ESD protection circuit 200 of the invention is fabricated onto the active device array substrate, there is no need to worry about interference or short circuit phenomenon occurred between the ESD protection circuit 200 and the electronic devices or dense circuits on the active device array substrate. Besides, the electronic devices or circuits on the active device array substrate can adopt the space under the diode 312 to perform layout. Therefore, the ESD protection circuit 300 of the invention can provide more layout possibilities.

Figure 6:
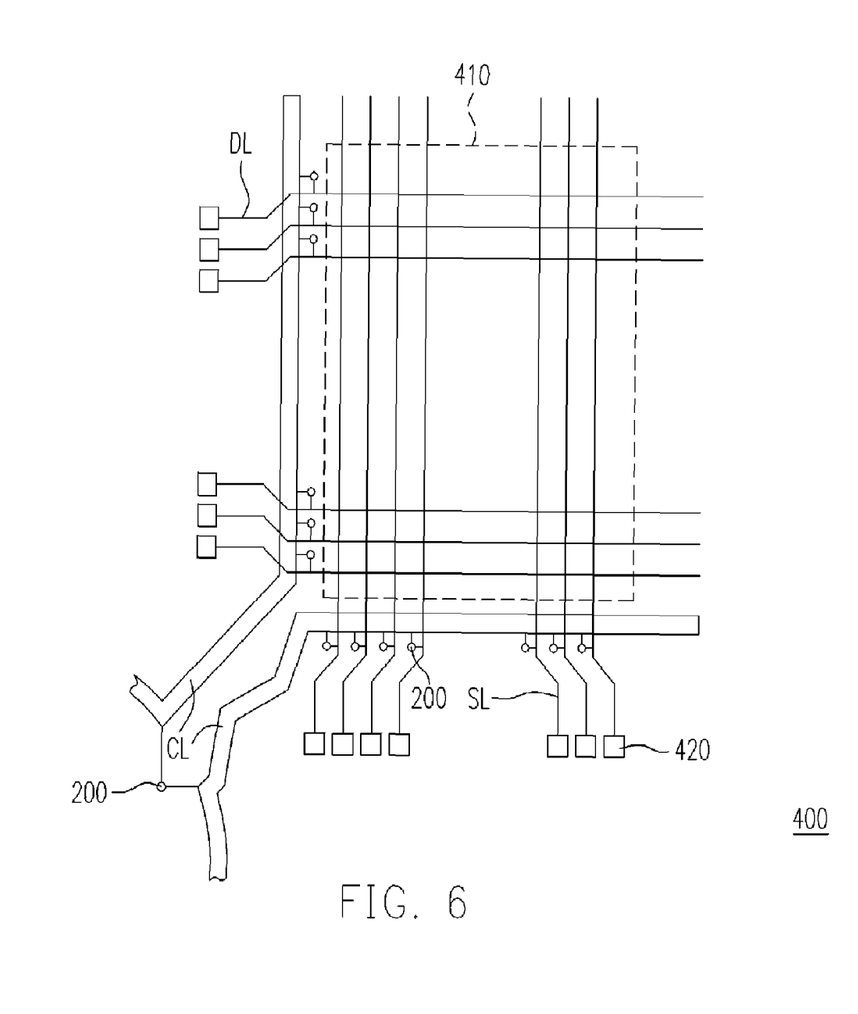
FIG. 6 shows a schematic circuit diagram of the active device array substrate.

An active device array substrate of the ESD protection circuit according to the invention will be illustrated below with reference to examples. FIG. 6 is a schematic circuit diagram of an active device array substrate. Referring to FIG. 6, an active device array substrate 400 mainly includes an active device array 410, multiple pads 420, multiple scan lines SL, multiple data lines DL, multiple common lines CL, and multiple ESD protection circuits 200. The active device array 410 is electrically connected to the scan lines SL and data lines DL. The pads 420 are disposed around the active device array 410 and respectively electrically connected to the scan lines SL and common lines CL.

Figure 7:
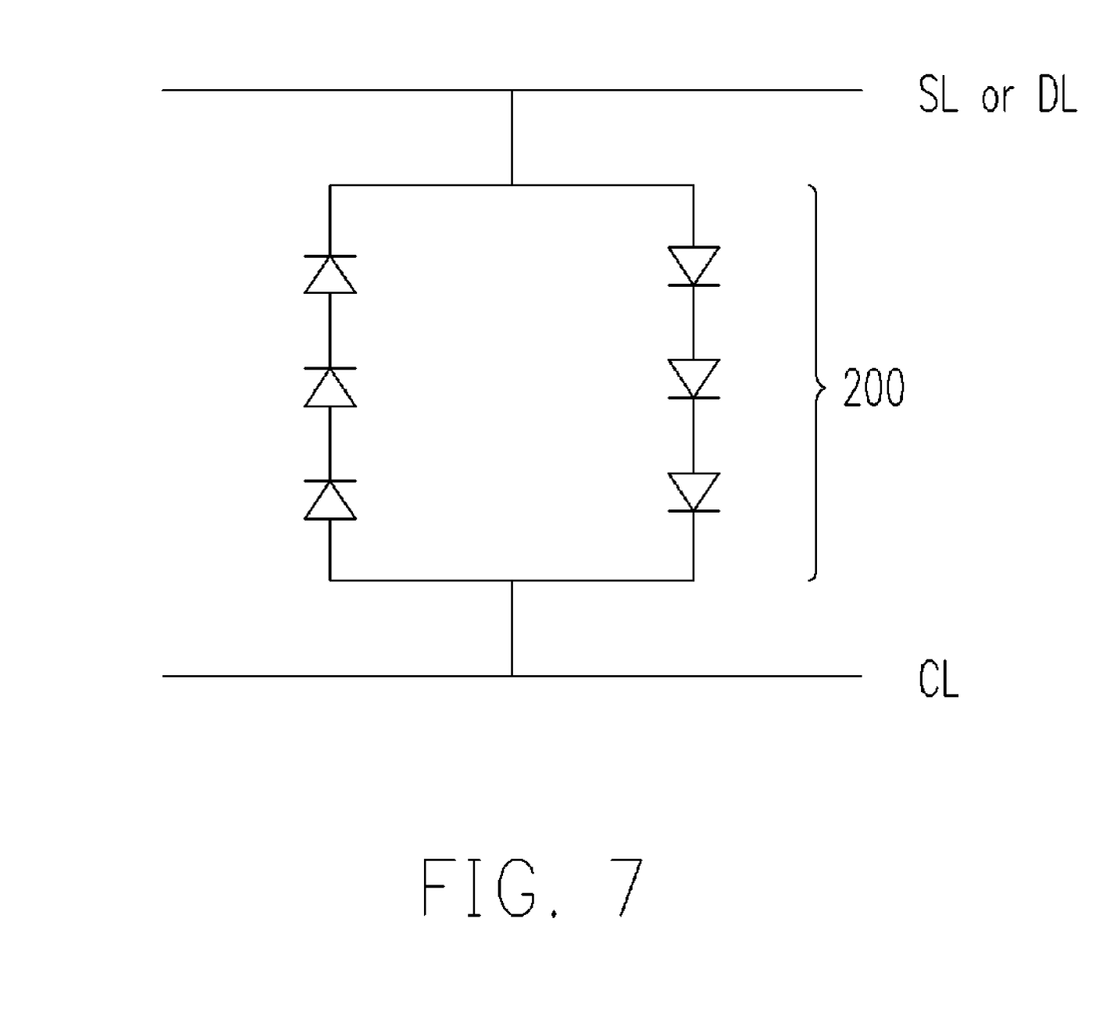
FIG. 7 shows a schematic enlarged view of a partial circuit of the active device array substrate.

FIG. 7 shows a schematic enlarge view of a partial circuit of the active device array substrate. Referring to FIG. 7, the ESD protection circuit 200 is electrically connected between the common line CL and the scan line SL, between two common lines CL, and between the common line CL and the data line DL. It should be declared that, the ESD protection circuit 200 shown in FIG. 7 can be an ESD protection circuit 300, and it is not limited herein. The active device array substrate 400 can be prevented from being damaged by electrostatic discharge by using the ESD protection circuit 200 (or ESD protection circuit 300).

In view of the above, the ESD protection circuit and the diode thereof in the invention have at least the following advantages:

1. The semiconductor pattern in the diode of the invention is disposed between the top conductor pattern and the bottom conductor pattern. The top conductor pattern is electrically connected to the bottom conductor pattern. As the conductor pattern of the diode of the invention can form two channels, the ESD protection circuit formed by the diode has preferred ability to conduct static electricity. Besides, even if the bottom conductor pattern or top conductor pattern is damaged, the diode will not lose its function totally. Therefore, the diode of the invention has preferred reliability.

2. The top conductor pattern in another diode of the invention is disposed above the semiconductor pattern, and no circuit belonging to the diode is formed under the semiconductor pattern. Therefore, layout of other devices or circuits can adopt the space under the diode of the invention.

3. The diode of the invention can be formed together with the pixel structure of the LCD panel onto the substrate; thus, no additional process is required.

Though the present invention has been disclosed above by the preferred embodiments, it is not intended to limit the invention. Anybody skilled in the art can make some modifications and variations without departing from the spirit and scope of the invention. Therefore, the protecting range of the invention falls in the appended claims.

What is claimed is:

1. A diode on a substrate, comprising:
   a semiconductor pattern;
   a first conductor pattern disposed on a portion of the semiconductor pattern;
   a second conductor pattern disposed on a portion of the semiconductor pattern, wherein the first conductor pattern and the second conductor pattern are separated from each other by the semiconductor pattern;
   an insulating layer disposed on the first conductor pattern, the second conductor pattern and the semiconductor pattern, wherein the insulating layer has a first contact window to expose a portion of the first conductor pattern; and
   a top conductor pattern disposed on the insulating layer, wherein the top conductor pattern is disposed above the first conductor pattern, the second conductor pattern and the semiconductor pattern, and the top conductor pattern is electrically connected to the first conductor pattern via the first contact window.

2. The diode as claimed in claim 1, wherein the semiconductor pattern comprises:
an amorphous silicon layer; and
an ohmic contact layer disposed between the amorphous silicon layer and the first conductor pattern, and between the amorphous silicon layer and the second conductor pattern.

3. The diode as claimed in claim 2, wherein the ohmic contact layer comprises an N-type doped amorphous silicon layer.

4. The diode as claimed in claim 1, wherein at least one of the first conductor pattern and the second conductor pattern is comprised of metal.

5. The diode as claimed in claim 1, wherein the top conductor pattern is comprised of indium tin oxide, indium zinc oxide, transparent conducting material, or metal.

6. The diode as claimed in claim 1, further comprising a dielectric layer disposed on the substrate, wherein the first conductor pattern, the second conductor pattern, and the insulating layer are disposed on the dielectric layer.

7. The diode as claimed in claim 1, further comprising:
a bottom conductor pattern disposed on the substrate, wherein the bottom conductor pattern is disposed beneath the semiconductor pattern; and
a dielectric layer disposed over the substrate to cover the bottom conductor pattern, wherein the dielectric layer and the insulating layer have a second contact window, and the bottom conductor pattern is electrically connected to the top conductor pattern via the second contact window.

8. The diode as claimed in claim 7, wherein the bottom conductor pattern is comprised of metal.

9. An electrostatic discharge (ESD) protection circuit on a substrate, comprising a plurality of diodes electrically connected to each other, wherein each of the plurality of diodes comprises:
a semiconductor pattern;
a first conductor pattern disposed on a portion of the semiconductor pattern;
a second conductor pattern disposed on a portion of the semiconductor pattern, wherein the first conductor pattern and the second conductor pattern are separated from each other by the semiconductor pattern;
an insulating layer disposed on the first conductor pattern, the second conductor pattern and the semiconductor pattern, wherein the insulating layer has a first contact window to expose a portion of the first conductor pattern; and
a top conductor pattern disposed on the insulating layer, wherein the top conductor pattern is disposed above the first conductor pattern, the second conductor pattern and the semiconductor pattern, and the top conductor pattern is electrically connected to the first conductor pattern via the first contact window.

10. The ESD protection circuit as claimed in claim 9, wherein the semiconductor pattern comprises:
an amorphous silicon layer; and
an ohmic contact layer disposed between the amorphous silicon layer and the first conductor pattern, and between the amorphous silicon layer and the second conductor pattern.

11. The ESD protection circuit as claimed in claim 10, wherein the ohmic contact layer comprises an N-type doped amorphous silicon layer.

12. The ESD protection circuit as claimed in claim 9, wherein at least one of the first conductor pattern and the second conductor pattern is comprised of metal.

13. The ESD protection circuit as claimed in claim 9, wherein the top conductor pattern is comprised of indium tin oxide, indium zinc oxide, transparent conducting material, or metal.

14. The ESD protection circuit as claimed in claim 9, wherein the diode further comprises a dielectric layer disposed on the substrate, and the first conductor pattern, the second conductor pattern, and the insulating layer are disposed on the dielectric layer.

15. The ESD protection circuit as claimed in claim 9, wherein the diode further comprises:
a bottom conductor pattern disposed on the substrate, wherein the bottom conductor pattern is disposed under the semiconductor pattern; and
a dielectric layer disposed over the substrate to cover the bottom conductor pattern, wherein the dielectric layer and the insulating layer has a second contact window, and the bottom conductor pattern is electrically connected to the top conductor pattern via the second contact window.

16. The ESD protection circuit as claimed in claim 15, wherein the bottom conductor pattern is comprised of metal.

17. The ESD protection circuit as claimed in claim 9, wherein the diodes are forward diodes or backward diodes.

18. The ESD protection circuit as claimed in claim 9, wherein a proportion of the diodes are forward diodes, and the other proportion of the diodes are backward diodes, wherein the forward diodes and the backward diodes are connected in parallel.

* * * * *